United States Patent [19]

Hamaguchi et al.

[11] Patent Number: 5,290,971
[45] Date of Patent: Mar. 1, 1994

[54] PRINTED CIRCUIT BOARD PROVIDED WITH A HIGHER DENSITY OF TERMINALS FOR HYBRID INTEGRATED CIRCUIT AND METHOD OF FABRICATING THE SAME

[75] Inventors: Tsuneo Hamaguchi; Masanobu Kohara, both of Amagasaki, Japan

[73] Assignee: Mitsubishi Denki Kabushiki Kaisha, Tokyo, Japan

[21] Appl. No.: 801,384

[22] Filed: Dec. 2, 1991

[30] Foreign Application Priority Data

Dec. 4, 1990 [JP] Japan .................................. 2-400353
May 9, 1991 [JP] Japan .................................. 3-104327

[51] Int. Cl.$^5$ ............................................. H05K 1/00
[52] U.S. Cl. ..................................... 174/267; 174/250; 174/254; 174/260; 174/261; 361/749; 361/784
[58] Field of Search ............... 174/250, 254, 255, 260, 174/261, 267; 361/396, 398, 412, 414; 29/830, 829

[56] References Cited

U.S. PATENT DOCUMENTS

| | | | |
|---|---|---|---|
| 3,689,991 | 9/1972 | Aird . | |
| 3,746,932 | 7/1973 | Hogan et al. | 361/414 X |
| 4,410,927 | 10/1983 | Butt | 361/414 X |
| 4,450,029 | 5/1984 | Holbert et al. | 29/830 X |
| 4,604,677 | 8/1986 | Suzuki et al. | 174/52 R X |
| 4,949,224 | 8/1990 | Yamamura et al. | 361/398 X |

FOREIGN PATENT DOCUMENTS

4113335C1 11/1992 Fed. Rep. of Germany .
63-273391A2 11/1988 Japan .

OTHER PUBLICATIONS

Lapedes, Daniel N., *Dictionary of Scientific and Technical Terms*, McGraw-Hill Book Company, NY 1978, pp. 445, 1562.

Larnerd, J. D., McBride, D. G.: IC Package Assemblies, IBM Technical Disclosure Bulletin, vol.21, Oct. 1978, pp. 1817–1818.

*Primary Examiner*—Lincoln Donovan
*Assistant Examiner*—Cheryl R. Figlin
*Attorney, Agent, or Firm*—Oblon, Spivak, McClelland, Maier & Neustadt

[57] ABSTRACT

This invention relates to printed circuit boards and a method of fabricating same wherein the input/output terminals are integral with the wiring layer of the printed circuit board. This arrangement allows for a higher density of input/output connections than is possible with conventional printed circuit boards.

13 Claims, 6 Drawing Sheets

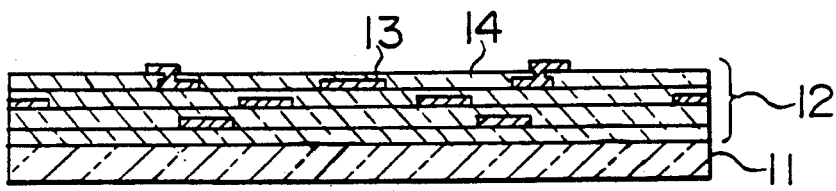
FIG. 2(a)
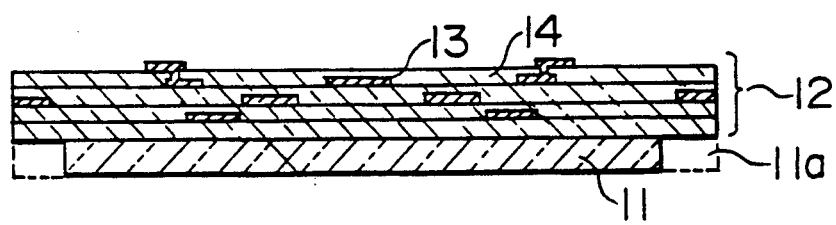
FIG. 2(b)
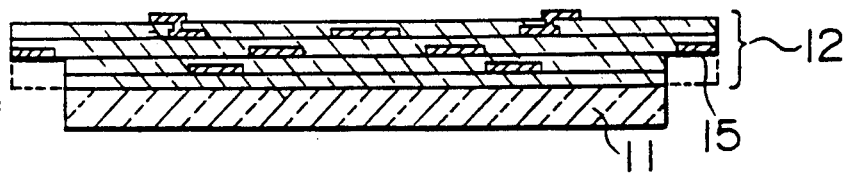
FIG. 2(c)
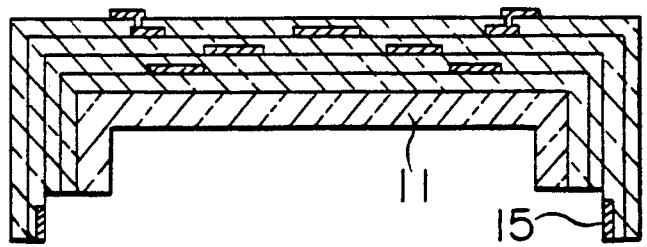
FIG. 2(d)
FIG. 3
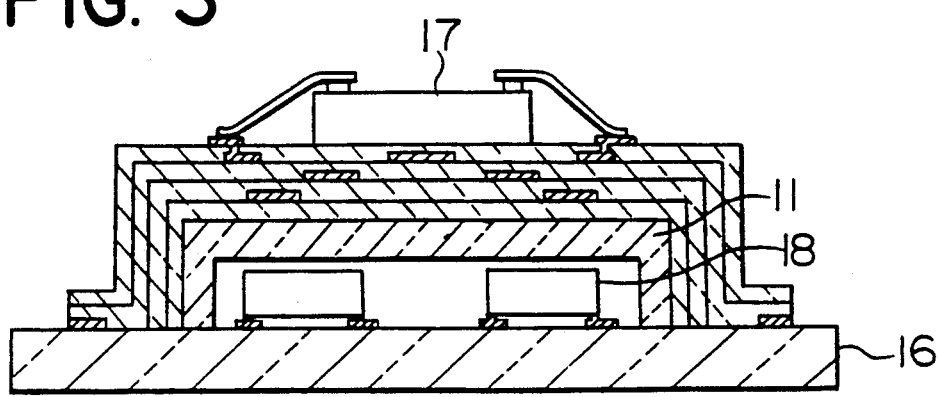

PRINTED CIRCUIT BOARD PROVIDED WITH A HIGHER DENSITY OF TERMINALS FOR HYBRID INTEGRATED CIRCUIT AND METHOD OF FABRICATING THE SAME

FIELD OF THE INVENTION

This invention relates to printed circuit boards and to a method of fabricating same which are intended to be used in the mounting of LSI'S, and other circuit elements with high density and a high degree of integration. These printed circuit boards find particular use as the substrates for hybrid integrated circuits.

BACKGROUND OF THE INVENTION

It is well known in the semiconductor art to manufacture and use so-called hybrid integrated circuits. These hybrid integrated circuits contain a number of circuit elements including LSI'S, chips and other devices which are in turn mounted on a printed circuit board. Typically, the hybrid integrated circuits comprise a ceramic substrate which is connected to the main circuit using input/output pins which are either pushed into the main circuit board for the connections or are mounted using surface technology onto the main circuit board. Conventional circuit boards for hybrid integrated chips are illustrated in "Ceramic Substrates For Functional Circuits" (Kogyo-Chosa-kai, Aug. 10, 1985, page 57) and in "A Handbook of Hybrid microelectronics" (Kogyo-Chosa-kai, Aug. 20, 1989, page 56). FIG. 9 illustrates a conventional printed circuit board used for hybrid integrated circuit chips which comprises a substrate 31, wiring layer 32, first conductors 33, insulators 34, through-holes 35, pins 36 and second conductors 37. The wiring layer 32 includes first conductors 33 and the insulators 34.

In the conventional hybrid integrated circuit printed circuit board, the through-holes 35 and the second conductors 37 are formed in the substrate 31. Formed on this substrate 31 by film forming techniques such as plating or sputtering, are first conductors 33 and, by photolithography and etching, are insulators 34 which thus produce wiring layer 32. Usually, the first conductors 33 consist of copper and the insulators 34 of polyimide although other conducting materials and insulators may be used. The first and second conductors 33 and 37 are connected to each other. Subsequently, pins 36 are attached to the substrate 31. The second conductors 37 are electrically conductive of the pins 36. The input/output signals are supplied to and emitted from the printed circuit board through the pins 36.

In the conventional hybrid integrated circuit board the pins 36 have a diameter not less than approximately 0.5 millimeters so that it is difficult to arrange a large number of them on a substrate 31. That is, the physical size of the pins restricts the number of input/output pins which can be utilized thereby limiting the complexity of the circuitry which can be carried by the hybrid integrated circuit chip since insufficient inputs and outputs are available. This further reduces the number of active devices which can be moderate in the hybrid integrated circuit chip thereby restricting the potential advantages of these devices. Moreover, jigs are employed when collectively attaching pins 36 to a substrate. For each different type of wiring pattern a different set of jigs must be used to attach the pins. This also creates unnecessary complexity in assembling the finished electronic device into which the hybrid integrated circuit chip is to be incorporated.

Accordingly, a need continues to exist for printed circuit board for hybrid integrated circuits which can be fabricated in high productivity and which is a large number of input/output terminals to allow high density mounting. In particular, need continues to exist for printed circuit board for hybrid integrated circuits having a high density of input/output terminals.

SUMMARY OF THE INVENTION

Accordingly, it is an object of the present invention to provide a printed circuit board for hybrid integrated circuits which may be fabricated at high productivity.

It is a further object of the present invention to provide a printed circuit board for hybrid integrated circuits which has a higher number of input/output terminals than is possible with conventional hybrid integrated print circuit boards.

It is yet another object of the present invention to provide a printed circuit board for hybrid integrated circuits which has a high density of input/output terminals.

These and other objects of the present invention have been obtained by providing a printed circuit board comprising a substrate and a wiring layer having conductors and insulators arranged such that the wiring layer at its peripheral section protrudes beyond the substrate. The conductors being exposed in the protruding peripheral sections of the wiring layer such that they can function as input/output terminals.

BRIEF DESCRIPTION OF THE DRAWINGS

FIG. 2 is a sectional drawing showing a second structural variation of the present invention.

FIG. 3 is a perspective view illustrating the use of the printed circuit board of FIG. 2.

DESCRIPTION OF THE PREFERRED EMBODIMENTS

Figure 9:
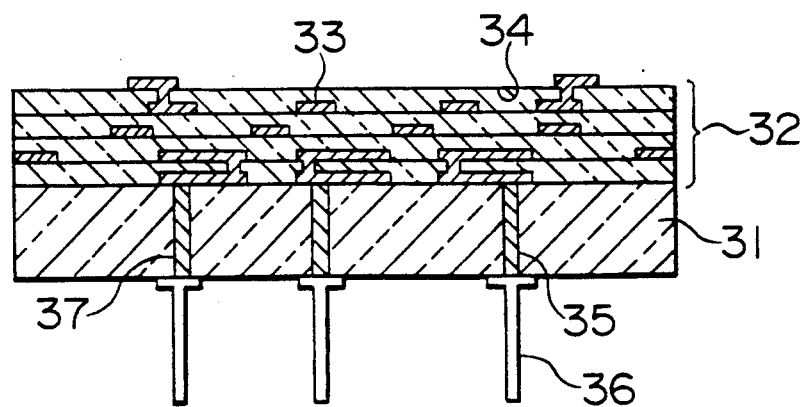
FIG. 9 is a sectional view of a conventional printed circuit board.

The printed circuit boards of the present invention may be generally planer in nature as illustrated in FIG. 1. The printed circuit board illustrated in FIG. 1 would be mounted on the main board with electrical connections being achieved by surface mounting of the input/output terminals 15 on the corresponding input/output terminals on the main board. In this embodiment, the hybrid integrated circuit is easily mounted at a high density of input/output terminals since these terminals need only be as wide as is necessary to carry effectively the current utilized by the circuit. In contrast, the prior art input/output terminals needed to be sufficiently large so as to withstand the physical abuse in handling and mounting the printed circuit board on the base printed circuit board. The terminal 15 comprises a conductor having a width and thickness being selected to meet the current carrying needs of the conductor. Preferably the width and thickness of the terminals is the same as that of the wiring layer, Generally such width and depths are on the order of microns and tans of microns. These dimensions should be contrasted with the typically 0.5 millimeter diameter pins used on conventional boards as illustrated in FIG. 9 and the 0.5 millimeter with fingers used in the conventional surface mounting of hybrid integrated circuits. However, as can be seen from FIG. 1, when this printed circuit board is mounted on the main printed circuit board, the area consumed by the printed circuit board for the hybrid integrated circuit becomes unavailable for active devices on the main board.

Figure 7:
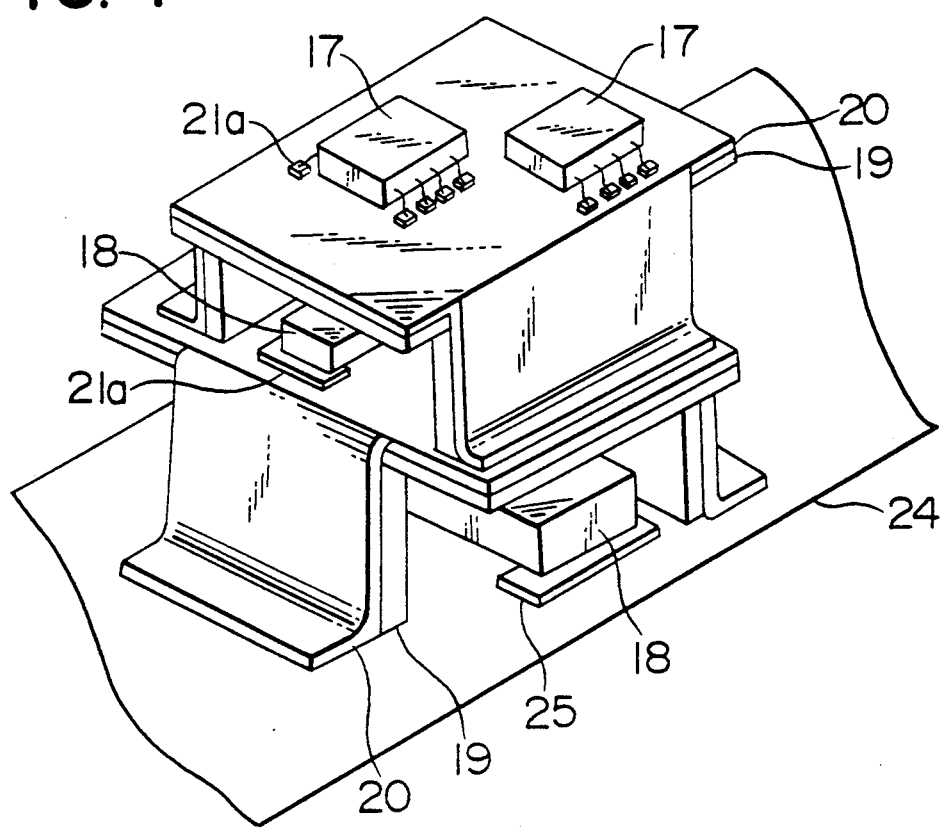
FIG. 7 is a perspective view illustrating one method of mounting the hybrid integrated circuit board illustrated in FIG. 6.

In order to provide better utilization of the space on the main board a second embodiment of the present invention has been developed. In particular, as illustrated in FIG. 2, a substrate having a substantially U-shaped sectional configuration is provided wherein the wiring layer has, conductors and insulators arranged on the U-shaped substrate such that at if the wiring layer at its peripheral sections protrudes beyond the substrate with the conductors being exposed in the peripheral sections of the wiring layer so as to function as input/output terminals. As can be seen from FIG. 3, when this particular configuration is mounted on a printed board, shown as 16, still further devices may be mounted on that same board in the area comprising the U of the hybrid integrated circuit printed board. This allows for more active devices per unit area on the main board. Still another printed circuit board of the present invention comprises a plurality of printed circuit boards stacked one on top of the other wherein each comprises a substrate having a substantially U-shaped sectional configuration and a wiring layer having conductors and insulators arranged on the substrate in such a manner that the wiring layer at its peripheral sections protrudes beyond the substrate with the peripheral sections of the wiring layer being exposed as input/output terminals. The input/output terminals formed on one printed circuit board being connected to expose conductors on the surface of the wiring layer of the lower printed circuit board. This arrangement is generally illustrated in FIG. 7 where two hybrid integrated circuit printed circuit boards are arranged one on top of the other in electrical connection. The lower of these printed circuit boards is mounted on the main circuit board. Although in this embodiment only two circuit boards are shown mounted in a vertical relationship, any number of circuit boards could be mounted in a similar manner in a vertical direction.

While the use of a U-shaped sectional configuration has been illustrated, other configurations which allow for multiple layers of active devices could also be used, such as an inverted V or the like.

The printed circuit boards of the present invention may be fabricated by forming on the surface of an acceptable substrate a wiring layer having conductors and insulators followed by removing the peripheral sections of the substrate in which the wiring layer has been formed such that the conductors of the wiring layer exposed in the peripheral regions and may be as input/output terminals. This process is illustrated sequentially in drawings FIG. 1. As a first step, the wiring layer 12 would be formed. Subsequently, the substrate would be etched to form peripheral regions shown at 11a. Portions of the insulating material in the wiring layer would be shown as 14a would be removed to expose the contacts 15. The nature of the substrate is not critical and may comprise material such as stainless steel, ceramics, or the like. The substrate is shown in FIG. 1 as item 11. The second process for fabricating the hybrid integrated circuit printed boards of the present invention is illustrated in FIG. 2. In this instance the substrate, at some point in the process, is deformed into the inverted U shape. This deformation may occur before or after removal of the excess portion of the substrate illustrated as item 11(a) in drawing FIG. 2. Preferably, the substrate material at 11a is removed prior to deformation for ease of processing. The substrate may then be deformed before removal of insulation materials 14a or after removal of the insulation. Again, from the viewpoint of processing ease, it is preferred to remove the insulation material to form the exposed input/output terminals before deforming the substrate into the desired configuration, where shown as an inverted U.

In the finished product, the wiring layer is mounted on a substrate in the central section of the wiring layer while in the peripheral sections the wiring layer is unsupported with the conductors being exposed in these peripheral sections. Instead of pins or other devices used in the prior art, the conductors thus exposed or used as the input/output terminals on the printed circuit board. Conventional surface mounting technology way be used to join these exposed conductors to the printed circuit board to which it is to be mounted.

As discussed briefly above, when a U-shaped sectional configuration is employed, the inner space of this cross-section may be used to mount other parts on the main board. Further, by stacking the plurality of printed circuit boards one on top of the other, each having a substrate with a U-shaped sectional configuration, the input/output terminals of one printed circuit board are connected to the appropriate conductors which are exposed on the upper surface of the printed circuit board one level below. Conversely, the conductors which are exposed on the upper surface of the lower printed circuit board can be connected to input/output terminals of the printed circuit board located Immediately above. In this manner, it is possible to achieve a higher density of devices for given surface area than is possible with prior art techniques.

in fabricating the printed circuit board the use of the hybrid integrated circuits as described above, all the components including the input/output terminals are formed by photolithography and etching and film forming techniques such as plating or sputtering so that they can be microscopic size in the order as small as several tens of microns. In this particular instance, the density of the input/output terminals is extremely high on the resulting printed circuit board.

In fabricating the printed circuit boards of this invention, the conductors may be made of copper, aluminum, gold, or other conductive metals while the insulators may be polyimides, benzocyclobutenes and the like. The preferred conductor is copper and the preferred insulator is polyimide.

The following is a detailed description of the various embodiments of this invention. These embodiments are for illustration only.

EMBODIMENT 1

FIG. 1 is a sectional drawing showing, in step sequence, a method of fabricating printed circuit boards in accordance with an embodiment of this invention. In the drawing, the reference numeral 11 indicates a substrate; the numeral 12 indicates a wiring layer 12 formed on the substrate 11; the numeral 13 indicates conductors forming the wiring layer 12; the numeral 14 indicates insulators likewise forming the wiring layer 12, and the numeral 15 indicates conductors serving as input/output terminals.

Figure 1A:
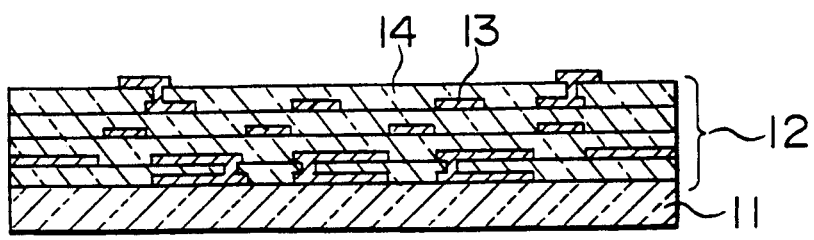
FIG. 1 is a sectional drawing illustrating one process for producing an embodiment of this invention.

The fabrication method comprises forming the wiring layer 12 on the substrate 11 as shown in FIG. 1(a). The wiring layer 12 is composed of the conductors 13 and the insulators 14; the conductors 13 are formed, for example, by plating or sputtering; and the insulators 14 are formed by photolithography and etching. In this embodiment, the conductors 13 are formed of copper by plating, and the insulators are formed of polyimide.

Figure 1B:
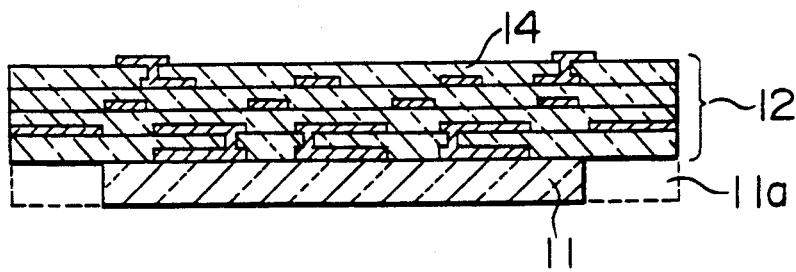

Next, that portion of the substrate 11 which is exclusive of the peripheral sections, i.e., the central section thereof, is protected by means of photoresist, etc., and the peripheral sections of the substrate 11 are removed, for example, by etching. Afterwards, the photoresist on the portion of the substrate exclusive of the peripheral sections is removed. FIG. 1(b) shows the printed circuit board in this condition. In this etching process, ferric chloride and hydrochloride acid may be used in the case were the substrate 11 consists of stainless steel; when the substrate is formed of alumina, phosphoric acid may be used; and, when the substrate consists of silicon, a mixed acid of nitric acid and hydrofluoric acid may be used. The sections 11a of FIG. 1(b), indicated by the broken lines, represent those portions of the substrate which have been removed.

Figure 1C:
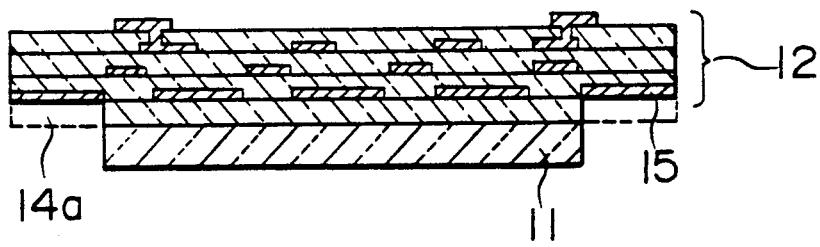
Figure 4A:
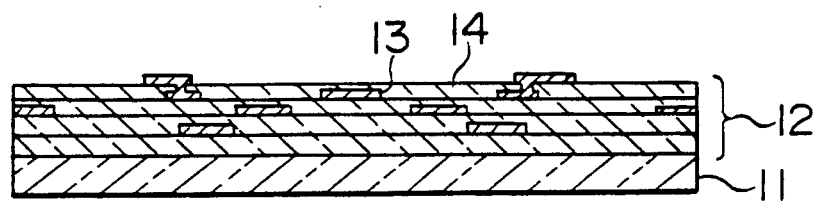
FIG. 4 is a sectional drawing illustrating a third embodiment producing the printed circuit board of this invention.
Figure 4B:
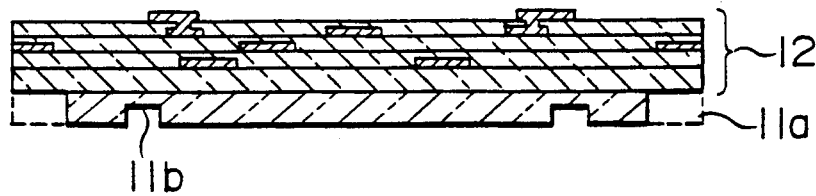
Figure 4C:
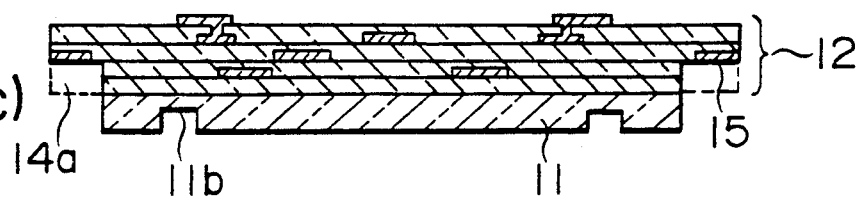
Figure 4D:
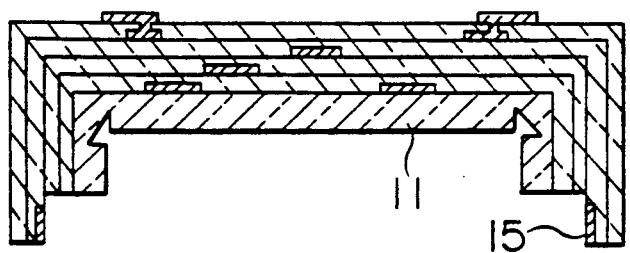

Following removal of substrate sections 11(a), those portions of the insulators 14 which correspond to the removed sections 11a of the substrate are removed to expose conductors 15, which constitute input/output terminals. FIG. 1(c) shows the printed circuit board in this condition. The sections 14a, indicated by the broken lines, represent those portions of the insulators 14 which have been removed. The exposure of the insulators 14 may be effected, for example, by an excimer laser. Since it removes exclusively those portions consisting of a polymeric material such as polyamide, an excismer laser can easily expose the conductors 15, which consists of a metal such as copper. The exposure of the conductors 15 can also be effected with ease by means of a plasma-asher.

Thus, the conductors 15 are formed by a technique such as plating or sputtering, so that they can be realized in a microscopic size of as small as several tens of microns. In a preferred embodiment, the conductor is about 10–40 microns, more preferably 20 microns and a thickness of 1-15 microns, more preferably 5 microns. Further,, the conductors 15 can be easily exposes making it possible to form a printed circuit board having a great number and density of input/output terminals.

Further, due to the structure in which the wiring layer 12 is provided such that its peripheral sections protrude beyond the substrate 11, with the conductors 15 being exposed in these protruding sections as input/output terminals, it is not necessary to use any pins, so that electrical connection can be effected with high accuracy in the peripheral sections, enabling the printed circuit board to be made thinner.

EMBODIMENT 2

FIG. 2 is a sectional drawing showing, in step sequence, a method of fabricating a printed circuit board in accordance with a second embodiment of this invention; and FIG. 3 is a perspective view showing how the printed circuit board of this embodiment can be used. In the drawings, the components indicated by the reference numerals 11 to 15 are the same as those of Embodiment 1.

The board is fabricated as follows: As shown in FIGS. 2(a) to 2(c), those steps from that of forming the wiring layer 12 on the substrate 11 to that of the exposing conductors 15 serving as input/output terminals are the same as those in Embodiment 1, shown in FIG. 1. In this embodiment, the substrate 11 in the condition shown in FIG. 2(c) is further formed such that it assumes a U-shaped sectional configuration. The printed circuit board in this condition is shown in FIG. 2(d).

In the printed circuit board constructed as described above, the protruding sections of the wiring layer 12 is flexible, so that, as shown in FIG. 3, this printed circuit board can be mounted, for example, on a printed board 16, with the protruding sections being bent. In that case, a part 17, e.g., an LSI, is mounted on the conductor exposed in the central section of the upper surface of the wiring layer 12. Further, by utilizing the inner space of the printed circuit board, parts 18, such as resistors or capacitors, are mounted on the printed board.

EMBODIMENT 3

FIG. 4 is a sectional drawing showing, in step sequence, a method of fabricating a printed circuit board in accordance with a third embodiment of this invention. When removing the peripheral sections of the substrate 11 by etching, those portions of the substrate 11 which correspond to the positions where it is to be bent are partly removed to form thin-walled sections lib, thereby facilitating the formation of the substrate.

EMBODIMENT 4

Figure 5A:
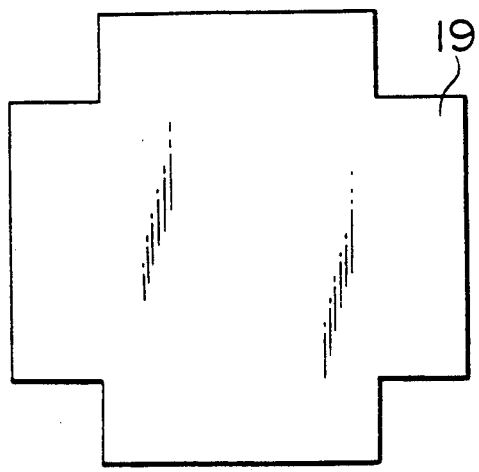
FIG. 5 illustrates the layout and manufacturing of yet another embodiment of this invention which is further illustrated in FIG. 6.
Figure 5B:
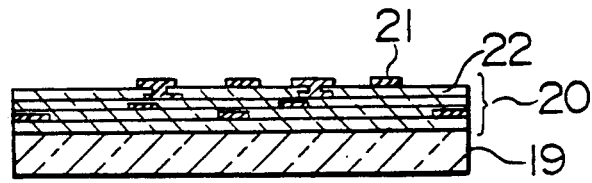

FIG. 5 is a drawing including a plan view and sectional views which show, in stop sequence, a method of fabricating a printed circuit board in accordance with a fourth embodiment of this invention; FIG. 6 is a perspective view showing an example of the way the printed circuit board of this embodiment is used; and FIG. 7 is a perspective view showing another example of the way the printed circuit board of this embodiment is used. In the drawings, the reference numeral 19 indicates a substrate which exhibits a cutout in each of the four corners thereof, as shown in FIG. 5(a); the reference numeral 20 indicates a wiring layer formed on the substrate 19; the numeral 21 indicates conductors forming the wiring layer 20; the numeral 22 indicates insulators likewise forming the wiring layer 20; and the numeral 23 indicates conductors serving as input/output terminals.

Next, the fabrication method will be described. First, the wiring layer 20 is formed on the substrate 19, which has a configuration as shown in FIG. 5(a). This condition is shown in FIG. 5(b). The wiring layer 20 is composed of the conductors 21 and the insulators 22. The conductors 21 are formed, for example, by plating or sputtering, and, as shown in FIG. 6, conductor portions 21a and 21b are exposed in the central section and and sections, respectively, of the upper surface of the wiring layer 20. The insulators 23 are formed by photolithography and etching. In this embodiment, the conductors 21 are formed of copper by plating; the insulators 22 are formed by polyimide.

Figure 5C:
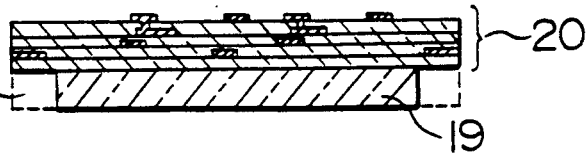
Figure 5D:
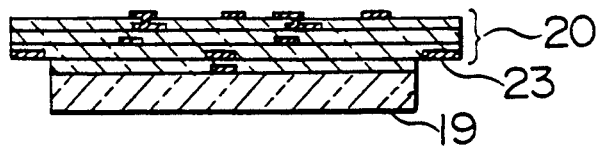
Figure 5E:
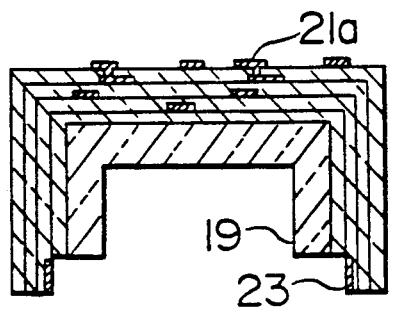
Figure 6:
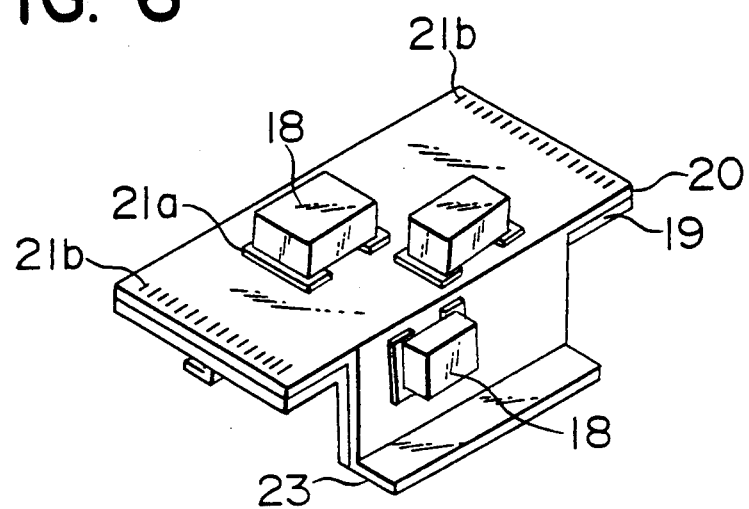
FIG. 6 is a perspective view of the circuit board of FIG. 5.

As shown in FIG. 5(c), the peripheral sections of the substrate 19 are removed. Then, as shown in FIG. 5(d), those portions of the insulators 22 corresponding to the removed portions of the substrate, 19a, are removed to expose the conductors 21 in the peripheral sections of the wiring layer 20, thereby forming a pair of input/output terminals 23. Afterwards, as shown in FIG. 5(e), the substrate 19 is so formed as to -assumed a substantially U-shaped sectional configuration; these steps are the same as those of Embodiment 2, shown in FIG. 2.

The printed circuit board constructed as described above allows the mounting, for example, of parts 18 on the upper surf ace of the central section thereof, as shown in FIG. 6; further, other parts 18 can also be mounted on the outer surfaces of the side sections thereof.

Further, as shown in FIG. 7, it is possible to stack together two of such printed circuit boards as described above, one on top of the other, mounting them on a mother board 24, such as a printed board. In that case, the pair of input/output terminals 23 formed on the upper printed circuit board are electrically connected to the conductors 21b exposed on the upper surface of the wiring layer of the lower printed circuit board. Further, parts 17, such as LSIS, are connected to the conductors 21a exposed in the central section of the upper surface of the upper printed circuit board; and further, by utilizing the inner spaces of these printed circuit boards, parts 18 which consist, for example, of resistors or capacitors, are connected to the conductors 21 on the lower printed circuit board and conductors 25 of the printed board 24.

EMBODIMENT 5

Figure 8:
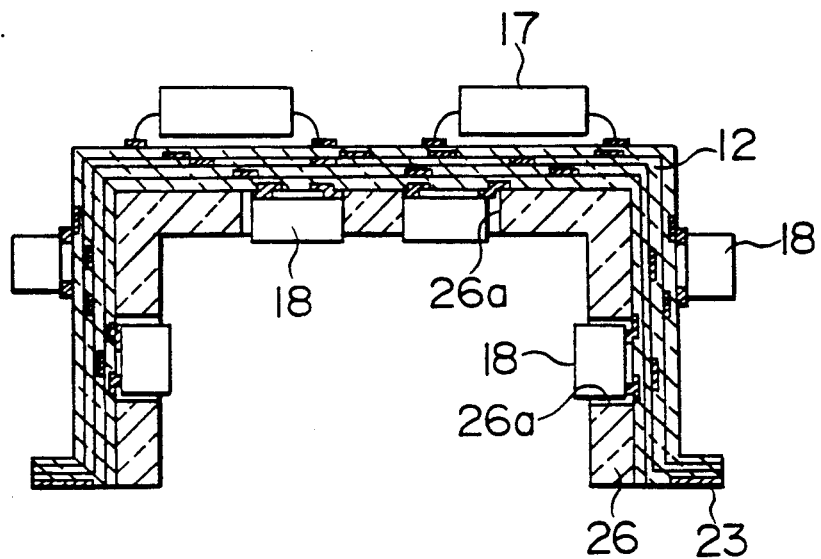
FIG. 8 is a perspective illustrating the use of the printed circuit boards of the present invention in forming a hybrid integrated circuit wherein active devices are mounted on both major surfaces of the board.

While, in Embodiments 2 and 4, described above, parts are mounted on one side of the printed circuit board, it is also possible, as shown in FIG. 8, to form holes 26a in the middle and side sections of the substrate 26; by inserting parts into these holes, it is possible to mount parts on both sides of the substrate.

Further, while, in the above-described embodiments, copper is used for the conductors, and polyamide for the insulators, it is also possible to employ aluminum, gold, etc. for the conductors, and benzocyclobutene, etc. for the insulators. Further, the wiring layer can generally be produced in various ways; the method of producing it is not restricted to that of the above embodiments.

As described above, the printed circuit board of this invention comprises: a substrate; and a wiring layer having conductors and insulators and arranged such that its peripheral sections protrude beyond the substrate; with the conductors being partly exposed in the protruding peripheral sections of the wiring layer as input/output terminals; due to this construction, it is possible to obtain a printed circuit board which can be fabricated with high productivity and which has a large number of input/output terminals to allow high density mounting.

The embodiments of the present invention offer a number of unique advantages. As discussed previously, the use of the U-shaped section or similar shaped sectional configuration for the substrate creates an inner space which can be utilized to mount parts to increase the mounting density. This configuration also offers the advantage that multiple boards can be stacked in a vertical direction to produce a three dimensional high density mounting while nevertheless providing a board having excellent heat dissipation affects. Air is free to flow around the various act of devices assisting in heat dissipation.

The method of fabricating the printed circuit boards of the present invention.

Obviously, numerous modifications ad variations of the present invention are possible in light of the above teachings. It is therefore to be understood that within the scope of the appended claims, the invention may be practiced otherwise than as specifically described herein.

What is claimed is new and desired to be secured by Letters Patent of the United States is:

1. A printed circuit board comprising:
   a substrate;
   a wiring layer on top of said substrate wherein said wiring layer includes conductors and insulators and is arranged on said substrate, at least part of said wiring layer having a periphery which is larger than a periphery of said substrate such that peripheral sections of said wiring layer protrude beyond said substrate, and wherein conductors in the protruding peripheral sections of said wiring layer are exposed and comprise input/output terminals of said printed circuit board with the input/output terminals located at the protruding peripheral sections.

2. The printed circuit board of claim 1, wherein said substrate has a substantially U-shaped sectional configuration.

3. A printed circuit board comprising a plurality of printed circuit boards stacked one on top of another each comprising a substrate having a substantially U-shaped sectional configuration and a wiring layer wherein said wiring layer has conductors and insulators and is arranged on said substrate such that the peripheral sections of said wiring layer protrude beyond said substrate; wherein the conductors located in said protruding peripheral sections of said wiring layer are exposed and comprise input/output terminals located in the protruding peripheral sections; the input/output terminals formed on one printed circuit board being connected to those conductors which are exposed on the upper surface of the wiring layer of another printed circuit board.

4. A method of fabricating a printed circuit board which comprises the steps of:
   (1) forming on a substrate a wiring layer having conductors and insulators;
   (2) removing peripheral sections of said substrate on which said wiring layer has been formed, such that the conductors of said wiring layer are exposed adjacent to locations where the peripheral sections of said substrate have been removed such that said wiring layer includes sections which protrude beyond peripheral sections of said substrate, and wherein the protruding sections of said wiring layer include the exposed conductors which form input/output terminals located in the protruding sections of the wiring layer.

5. The method of claim 4, wherein said substrate is deformed such a manner as to impart thereto a substantially U-shaped configuration.

6. The method of claim 4, wherein said substrate is selected from the group consisting of steel, stainless steel, aluminum, silicon and ceramic materials.

7. The method of claim 4, wherein the step of removing further includes first removing peripheral sections of said substrate, and thereafter removing portions of insulators of said wiring layer to expose conductors.

8. The method of claim 4, wherein the step of providing a wiring layer including conductors and insulators includes forming said conductors by one of plating and sputtering, and forming insulators by photolithography and etching.

9. The method of claim 8, wherein the step of providing a wiring layer further includes providing a wiring layer having a width dimension on the order of tens of microns.

10. The method of claim 7, wherein the step of removing peripheral sections of said substrate includes protecting a central section of said substrate with a photoresist, and removing the peripheral sections by etching; and wherein the sep of removing insulators includes removing insulators utilizing one of an excimer laser and a plasma-asher.

11. The printed circuit board of claim 1, wherein said input/output terminals have a width dimension on the order of tens of microns.

12. The printed circuit board of claim 1, wherein said printed circuit board is attached to a second circuit board, with conductors in the protruding peripheral sections of the printed circuit board which are exposed to form input/output terminals directly in contact with the second circuit board without utilizing pins or bolts.

13. The printed circuit board of claim 1, wherein the exposed conductors are provided in a lower portion of said wiring layer adjacent to said substrate, with the exposed conductors facing downwardly.

* * * * *